United States Patent [19]

Maixner et al.

[11] Patent Number: 4,641,002
[45] Date of Patent: Feb. 3, 1987

[54] ELECTRICAL CONTACT

[75] Inventors: Uwe Maixner, Barum; Dieter Milferstaedt, Tespe-Buetlingen, both of Fed. Rep. of Germany

[73] Assignee: Gesellschaft Fuer Kernenerg Ieverwertung in Schiffbau und Schiffahat GmbH, Fed. Rep. of Germany

[21] Appl. No.: 779,301

[22] Filed: Sep. 23, 1985

Related U.S. Application Data

[60] Continuation of Ser. No. 525,968, Aug. 24, 1983, abandoned, which is a division of Ser. No. 057,693, Jul. 16, 1979, Pat. No. 4,413,302.

[30] Foreign Application Priority Data

Jul. 19, 1978 [DE] Fed. Rep. of Germany ....... 2831791

[51] Int. Cl.⁴ ............................................. H01H 1/02
[52] U.S. Cl. .................................................. 200/268
[58] Field of Search ............... 361/212, 216, 220, 222; 313/313, 107; 200/19 R, 19 DC, 19 DR, 262, 263, 264, 265, 267, 268; 428/627, 628

[56] References Cited

U.S. PATENT DOCUMENTS

| | | | |
|---|---|---|---|
| 2,812,406 | 11/1957 | Egan | 200/268 X |
| 3,787,223 | 1/1974 | Reedy, Jr. | 428/628 X |
| 4,129,765 | 12/1978 | Herklotz et al. | 200/268 |
| 4,217,470 | 8/1980 | Kirner | 200/19 DR X |
| 4,369,343 | 1/1983 | Sone et al. | 200/19 DR X |
| 4,405,849 | 9/1983 | Frame | 200/262 |

FOREIGN PATENT DOCUMENTS

| | | | |
|---|---|---|---|
| 7115 | 8/1981 | European Pat. Off. | |
| 56-159016 | 12/1981 | Japan | 200/262 |
| 56-159028 | 12/1981 | Japan | 200/268 |
| 2130795A | 6/1984 | United Kingdom | 200/268 |

Primary Examiner—J. R. Scott
Attorney, Agent, or Firm—Handal & Morofsky

[57] ABSTRACT

A pair of contacts are mounted on structural members. Each contact includes a body made of conductive metal selected from the group consisting of titanium and zirconium. At least one of the contact body surfaces has a layer of titanium nitride or zirconium nitride in intimate and direct contact with the metallic surface of the body.

1 Claim, 3 Drawing Figures

ELECTRICAL CONTACT

This application is a continuation, of application Ser. No. 525,968, filed Aug. 24, 1983, now abandoned, which is a division of application Ser. No. 057,693 filed July 16, 1979, now U.S. Pat. No. 4,413,302.

FIELD OF THE INVENTION

The present invention relates to a structural member made from a metallic material which has an upper or outer surface which is exposed to the danger of charge buildingup or thereon. Especially, but not exclusively, the present invention relates to a structural member made from a metallic material for a high vacuum apparatus and which has an outer surface, the electric potential of which may influence a charge carrying beam which is passing through the vacuum apparatus.

BACKGROUND OF THE INVENTION

It has been known that the electrostatic build-up of charge on insulating surfaces in a high vacuum arrangement which operates with a charge carrying or transporting beam, may considerably influence the function of such high vacuum apparatus, inasmuch as the electrostatic stray fields produced by the electrostatic charge build-up may cause frequently an undesirable deflection of the charged particles.

A local accumulation of the interfering electrostatic outer surface charge build-up on the upper surface of a structural member in a high vacuum arrangement, which surface is exposed to the vacuum, may appear not only when the structural member is made from an electrically insulating material, such as glass or ceramic, but also in the cases when the structural member is made from metal on which, during the manufacturing or operation, an insulating upper or free surface layer has been formed. Especially the oxides of many metals which are being used as structural members in high vacuum arrangements, such as aluminum, copper, tantalum, chromium and iron metals, form oxide layers which, already at a very thin layer thickness, can bring about a good insulation and can lead, at the same time, to disturbing charge accumulations on the upper surface of the structural members, especially when relatively many charge carriers per time unit fall on the upper surface.

Also in many other apparatus and arrangements, problems might appear due to the fact that a metal upper surface is exposed during operation of the apparatus to the atmosphere or to a gas having an atmospheric pressure or above it, and, as a result, by oxidation or other type of changes it becomes electrically insulating or at least becomes a relatively bad conductor. This is more so when the upper surface during operation will go into an alternating relationship with an electric field and/or when a local charge build-up on the upper or free surface will, or may cause disturbances. Illustrative examples to this point are the electrodes of rotating condensers, radiators and antennas for electromagnetic waves, especially for ultrashort and microwaves, such as horn radiators and parabolic mirror antennas, wave guides, cavity resonators, as well as the contact surfaces and upper surfaces of the stators and rotors of a centrifuge, especially those of an ultra centrifuge, or those of a turbo-molecular pump, as well as the surfaces which in operation move at a high speed with respect to each other, which might be for example, exceed 10 m/s.

It became known from West German OS No. 2639033, having its U.S. counterpart as U.S. Pat. No. 4,123,655, to produce structural elements for high vacuum apparatus from metals having low spattering rate and a very small desorption rate, such as from titanium, zirconium and similar materials and their alloys; however, nothing is mentioned about the electrical character of the upper surfaces involved. The same is true about West German OS No. 2500339, which discloses a particle trap for molecular, atomic or subatomic particles, which comprises a three-dimensional network which forms a plurality of mutually interconnected free lines and which may be made from graphite, copper, nickel, chromium, iron, titanium, wolfram, cobalt, molybdenum and similar materials. In such known particle trap, however, there is no weight or consideration given to produce an upper or free surface which is free of charge build-up or that a possible and undesirable build-up of charge on the upper surface may make the collection by the charge carriers difficult or prevent it completely. On the contrary, structural elements can be made which are similarly shaped as the one proposed by the present invention, especially structural elements having a plurality of narrow holes. This can be seen in the West German OS No. 2,639,033, however, without any special treatment of the upper surfaces, even if such structural elements are being proposed as time durable, stable and insensitive particle traps for charged particles.

SUMMARY OF THE INVENTION

It is, therefore, an object of the present invention to provide a metallic structural member having an upper surface which is formed in such a manner that it prevents undesirable surface charge formations thereon during operation of an apparatus which may incorporate such structural member.

It is a further object of the present invention to provide an improved structural member from metal having an upper surface which is formed in such a manner that despite the normally influencing affects during operation of the device into which the structural element is incorporated, it will retain sufficient upper surface conductivity.

According to the present invention the upper surface of the structural member carries a layer from a conductive or semiconductive compound which, despite the influences to which the upper surface during normal operation is exposed, such as to the influences of oxygen, remains stable. According to the present invention, the compound is preferably an electrically, relatively good conducting nitride, such as zirconium or titanium nitride.

The compound itself is a compound of at least one of the metals which is included in the metallic material of the structural member.

Preferably the metallic material fully or partially is made from titanium and/or zirconium and the compound forming the upper surface is a titanium nitride and/or zirconium nitride.

The upper surface layer according to the present invention will prevent the appearance of disturbing local charge build-ups and the electrically undefined relationships appearing in the border region between the structural member and its surroundings and, in addition, it will operate as a protective layer, for example, against oxidation. The upper surface layer according to the present invention will reduce further the electrical sluggishness in response of an electrode arrangement, inasmuch as a build-up and a reduction of the polarization and induction charges on the end before the electrode upper surfaces, will not be present.

BRIEF DESCRIPTION OF THE DRAWING

The present invention will become more readily apparent from the following description of preferred embodiments thereof shown and described with respect to the attached drawing, in which.

DESCRIPTION OF THE PREFERRED EMBODIMENT

Figure 1:
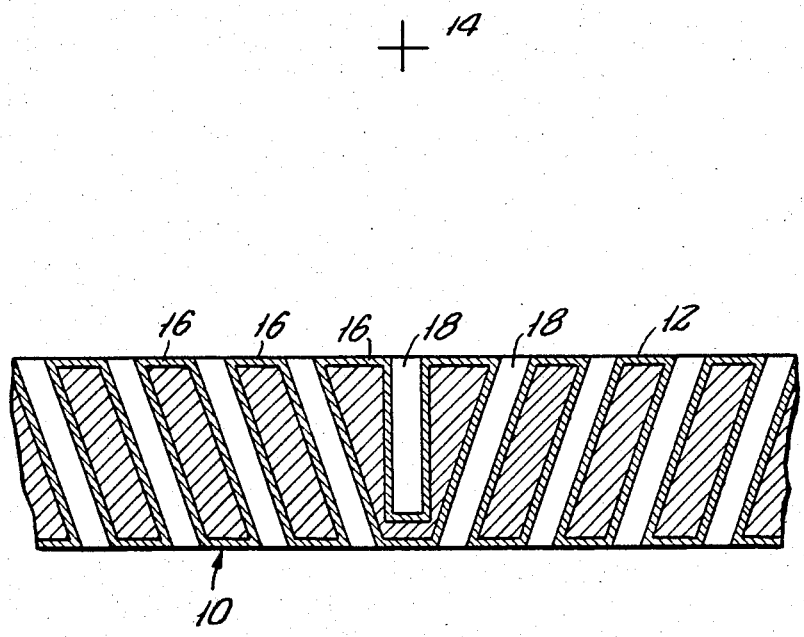
FIG. 1 is a schematic illustration of an exemplary embodiment of the present invention in the form of a plate-shaped metallic structural element for a high vacuum arrangement.

The structural member or element 10 which is illustrated FIG. 1 of the drawing in 2 broken-away section and on an enlarged scale, can be either an orifice plate, or a separating wall or a similar structural element for a high vacuum arrangement which has an upper surface 12 the electric potential of which may have an influence on a charge carrying beam 14, schematically illustrated in the figure and, which beam 14 passes within the vacuum arrangement. In general, the case here is one where the upper surfaces can be seen from the side of the charge carrying beam; however, there are cases in which the beam can be influenced through fields which originate from charges built up on upper surfaces and which are not seen from the path of the beam.

In conventional structural members made from aluminum or steel, during the production or heat treatment thereof or even in operation, upper surface layers such as oxide layers form which electrically are good insulators and thereby permit the appearance of local upper surface charges. According to the present invention such occurrence will be prevented in that the upper surface will comprise a layer 16 which carries a compound which is conductive or semiconductive. The chemical compound is selected according to the present invention in such a manner that its conductive or semiconductive properties will be retained during normal operation of the structural elements 10, 20 and 30, and even in the event when the vacuum arrangement becomes aerated or during bombardment by charge carriers which are scattered from the beam path during operation, or by similar events.

The structural element 10 preferrably is formed and shaped in the fashion as taught by the West German OS No. 2639033. The structural element 10 can also have a plurality of adjacently lying substantially cylindrical apertures 18 formed therein which, as illustrated, are acting as transit apertures; however, they can also be formed as blind holes. The apertures or holes run substantially perpendicularly with respect to the upper or free surface 12; however, the concept "substantially perpendicular" should not be understood only to mean exact perpendicularity, because the holes can have a certain inclination, such as illustrated in the drawing, wherein it can be seen, that from the side of the beam 14 there is no straight line of sight through the apertures 18 or, in other words, the particles which become scattered away from the beam path in the direction forward of the beam, cannot go through the apertures 18 in a straight path. The depth of the apertures 18, in general, is greater than their diameter and, the diameter is preferably smaller than 0.5 mm and preferably, the apertures take up about 65–86% of the upper surface.

The cross sectional area of the apertures can be made smaller as the distance increases from the upper surface. Also the upper surface layer 16 can extend into the aperatures 18 and cover completely or partially their wall portions. Preferably, the apertures are of cylindrical or slightly conical shape.

The layer 16 can be made from titanium nitride or from titanium silicide. When the structural members 10, 20 or 30 are made from titanium, then the titanium nitride or silicide layer is formed thereon in situ.

The titanium nitride has the special advantage that it is very stable and has a specific electrical resistance which is smaller by a factor 2 than that of the metallic titanium. The titanium oxide, the formation of which will be prevented by the titanium nitride layer, on the other hand, would have a much higher specific resistance than the metallic titanium.

A layer 16 which is made from titanium nitride on a structural member 10, 20 or 30 which is made from titanium itself, can be produced in a chemical fashion, wherein for example, one may proceed similarly as in the known nitriding of steel. TiN can be produced also through a reaction $TiCl_4$ with $N_2$ in a hydrogen plasma, or in a growing process. Similarly this is also true for the zirconium if that is used instead of titanium.

A nitride layer can be also frequently produced in a readily manufactured vacuum arrangement by providing in the vacuum arrangement a nitrogen filling under a certain pressure, and operating it in a manner that the upper layer surface of the structural element under consideration is exposed to the alternate effect of the beam as well as the charge carriers which are scattered from the beam and between the nitrogen on the upper surface. This process can be repeated several times which may be called a periodic formation of the surface of the structural element of the apparatus and, has the advantage, that the nitride layer will be created generally automatically and there, where there is a need for it. It is, of course, a condition precedent that the structural element should include a nitride builder, such as titanium or zirconium, which both form a nitride having a sufficiently low conductivity.

The upper surface layer in general should have a surface resistance of less than $10^7$ Ohm cm. Preferably the surface resistance should be substantially lower than for example, $10^2$ Ohm cm, or even less.

The thickness of the layer is not critical; it can be for example between about 10 mm and 1 μm. Where the structural elements 10, 20 and 30 are made from a getter metal, such as titanium, and it should operate itself as a volume getter, then the layer thickness should be made only thick enough in order to retain a desired upper surface conductivity. On the other hand, a heavier TiN layer is necessary on titanium when the volume gettering should be prevented, for example, in a gas filled system, like in $H_2$ Thyratrons, electrically pumped gas lasers, and in similar arrangements. In the making of the above discussed upper surface layer it is important that no additional insulating layers should be allowed to form, like in a galvanic enrichment of an upper surface, such as during the gold coating of a copper substrate, which would take place between the substrate and the deposited layer. The layer must be carried on also onto a clean metallic upper surface or formed thereon and, during the formation in situ by the alternating effect between beam, nitrogen and, for example titanium, the presence of oxygen must be avoided in order to avoid the formation of a highly insulating oxide layer.

The upper surface layer 16 prevents not only the formation of undesirable upper surface charges, but also reduces upper surface vaporization which frequently occurs in the operation of a vacuum arrangement and, due to its very high melting temperature, which in the case of titanium and zirconium nitride is above 2,500° C., it presents a very effective protection against melting.

The structural element under consideration should not necessarily be made from a massive titanium and/or zirconium. It can also be made from other materials and must have only an upper surface region which, for example, includes titanium and/or zirconium, which is then provided with the upper surface layer according to the present invention and, thereby, the "structural member" in the meaning of the present invention is created.

The upper surface layer made from TiN and other similarly appropriate compounds is also fully nonmagnetic which is very advantageous in many applications.

Figure 2:
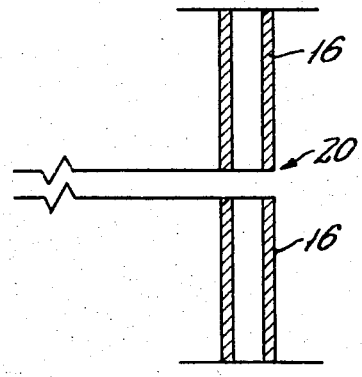
FIG. 2 illustrates a dipole antenna.

Illustrated in FIG. 2 is a dipole antenna 20 having a surface layer 16 according to the teachings of the present invention.

Figure 3:
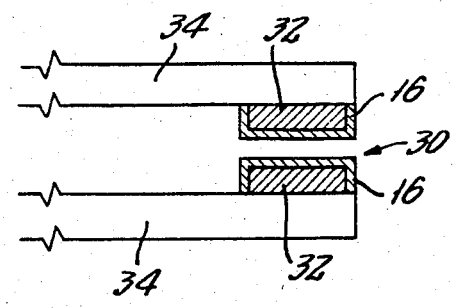
FIG. 3 illustrates a pair of electrical contacts.

FIG. 3 illustrates a pair of electrical contacts incorporating the principles of the present invention. In particular, the electrical contacts 30, for the conduction of electricity when they are closed, are comprised of opposing bodies 32 mounted to or supported by respective structural members 34. Each body 32 is made of titanium or zirconium metal and has an outer layer of titanium nitride or zirconium nitride 16 coated thereon. It should be understood that at least one of body surfaces 32 is required to have a titanium nitride or zirconium nitride layer 16.

It would be apparent from the description of the invention given above that further modifications and alternative forms may be developed without departing from the spirit of the invention. Thus, it is intended that the true scope of the invention be limited only by the following claims.

We claim:

1. A pair of electric contacts, each contact having an electrically conductive metallic body comprising a metal selected from the group consisting of titanium and zirconium, each of said contact bodies forming one of a pair of cooperating, mutually engageable contact surfaces, at least one of said electric contact surfaces having a layer of titanium nitride or zirconium nitride, said layer being intimate and direct contact with the metal of said body without an intervening oxide layer.

* * * * *